United States Patent [19]
Iwasaki et al.

[11] Patent Number: 6,140,633
[45] Date of Patent: Oct. 31, 2000

[54] MULTI-OPTICAL-PATH PHOTOELECTRIC SWITCH

[75] Inventors: Koumei Iwasaki; Michiaki Oka, both of Osaka, Japan

[73] Assignee: Keyence Corporation, Osaka, Japan

[21] Appl. No.: 09/158,517

[22] Filed: Sep. 22, 1998

[30] Foreign Application Priority Data

May 7, 1998 [JP] Japan ................................ 10-164081

[51] Int. Cl.⁷ ............................... G01V 9/04; H01J 5/02
[52] U.S. Cl. ......................... 250/221; 250/239; 340/556
[58] Field of Search ................. 250/221, 222.1, 250/214 SN, 239; 340/555–557; 362/269, 270, 277, 285, 295

[56] References Cited

U.S. PATENT DOCUMENTS

| | | | |
|---|---|---|---|
| 3,805,061 | 4/1974 | De Missimy et al. | 250/221 |
| 4,704,524 | 11/1987 | Masaki et al. | 250/239 |
| 4,742,337 | 5/1988 | Haag | 340/556 |
| 5,003,169 | 3/1991 | Sakaguchi et al. | 250/221 |
| 5,015,840 | 5/1991 | Blau | 250/221 |

*Primary Examiner*—Stephone B. Allen
*Attorney, Agent, or Firm*—Sughrue, Mion, Zinn, Macpeak & Seas, PLLC

[57] ABSTRACT

A multi-optical-path photoelectric switch includes: a light emitting unit having a plurality of light emitting devices; and a light receiving unit having the same number of light receiving devices as said light emitting devices. Each unit includes, a shaft member at one end, a support member rotatably supporting said shaft member, and a joint member, wherein when said joint member is tightened, said support member fixs said shaft member, and when said joint member is loosened, said support member allows said shaft member to rotate.

7 Claims, 7 Drawing Sheets

MULTI-OPTICAL-PATH PHOTOELECTRIC SWITCH

BACKGROUND OF THE INVENTION

The present invention relates to a multi-optical-path photoelectric switch having a light emitting portion incorporating a plurality of light emitting devices and a light receiving portion having the same number of light receiving devices as that of the light emitting devices.

As a photoelectric switch for detecting a predetermined area, a multi-optical-path photoelectric switch is known which is structured as shown in FIG. 12 and which incorporates optical paths or channels, the number of which can be varied. FIG. 12 is a perspective view showing a multi-optical-path photoelectric switch having six optical paths, the multi-optical-path photoelectric switch having a light emitting portion 51 and a light receiving portion 52 disposed opposite to each other. The light emitting portion 51 has six light emitting devices (not shown). The light receiving portion 52 has six light receiving devices 53a to 53f therein. The light emitting devices and the corresponding light receiving devices 53a to 53f are structured such that their optical paths coincide with each other. The light receiving portion 52 incorporates a main unit 54, an extension unit 55 which can be connected to the main unit 54 and mutually to an end unit 56, and the end unit 56 can be connected to the extension unit 55 and the main unit 54.

FIG. 13 is a diagram showing the assembled light receiving portion 52 of the multi-optical-path photoelectric switch shown in FIG. 12. The main unit 54 has a stepped portion in substantially the central portion thereof and incorporates a large-diameter portion 54a and a small-diameter portion 54b formed integrally with the large-diameter portion 54a. The small-diameter portion 54b has an engaging projection 54c and a guide groove 54d. The extension unit 55 has a stepped portion in substantially the central portion thereof and incorporates a hollow joint portion 55a and a light-receiving-portion mounting portion 55c formed integrally with the joint portion 55a. An engaging hole 55b to which an engaging projection 54c of the main unit 54 is engaged is formed in the side surface of the hollow joint portion 55a. The light-receiving-portion mounting portion 55c has an engaging projection 55d and a guide groove 55e. An engaging hole 56a to which the engaging projection 55d of the extension unit 55 is engaged is formed in the side surface of the end unit 56.

When the foregoing units are assembled into the multi-optical-path photoelectric switch, the small-diameter portion 54b of the main unit 54 is inserted into the joint portion 55a of the extension unit 55. Then, a projection (not shown) of the extension unit 55 is slid in the guide groove 54d so that the main unit 54 and the extension unit 55 are connected to each other. At this time, a female connector provided for either of the foregoing units and a male connector provided for the other unit are connected to each other. Moreover, the light-receiving-portion mounting portion 55c of the extension unit 55 is inserted into the end unit 56 so as to slide a projection (not shown) of the end unit 56 in the guide groove 5e. Thus, the extension unit 55 and the end unit 56 are connected to each other. At this time, a female connector provided for either of the foregoing units and a male connector provided for the other unit are connected to each other. As a result, the main unit 54, the extension unit 55 and the end unit 56 are mechanically and electrically connected to one another.

A multi-optical-path photoelectric switch of the type shown in FIG. 12 is sometimes required to change directions of optical axes of the same multi-optical-path photoelectric switch to meet various purposes. However, the conventional multi-optical-path photoelectric switch is arranged to be used such that an end unit or units at two ends are secured by a support member, such as a support mount or a support frame. Therefore, the optical axis is limited to a predetermined direction. Thus, change of the optical axis must be performed by changing the position at which the unit is secured. Therefore, change of the support member is sometimes required. As a result, there arises a problem in that a requirement for changing the direction of the optical axis cannot easily be met.

SUMMARY OF THE INVENTION

In view of the foregoing, an object of the present invention is to provide a multi-optical-path photoelectric switch which is capable of easily changing a direction of an optical axis of a light emitting portion and a light receiving portion.

To achieve the object, the present invention provide with a multi-optical-path photoelectric switch comprising: a light emitting unit having a plurality of light emitting devices; and a light receiving unit having the same number of light receiving devices as the light emitting devices, each unit including, a shaft member at one end, a support member rotatably supporting the shaft member, and a joint member, wherein when the joint member is tightened, the support member fixs the shaft member, and when the joint member is loosened, the support member allows the shaft member to rotate.

Furthermore, in the multi-optical-path photoelectric switch described above, the light emitting unit comprises plural units each having the predetermined number of the light emitting devices, and the light receiving unit comprises plural units each having the light receiving devices, the number of which is the predetermined number which is the same as the number of said light emitting devices.

According to the present invention, the structure that the unit of the light emitting portion and that of the light receiving portion is provided with a shaft member, the overall outer portion is rotatively held by a joint member secured to the support member. Therefore, when the shaft member is rotated, the direction of the optical axis can easily be changed to an arbitrary circumferential direction.

Furthermore, the direction of optical axes of even a multi-optical-path photoelectric switch having a structure that the number of optical axes is changed by varying the number of units can be easily changed to an arbitrary circumferential direction.

DETAILED DESCRIPTION OF THE PREFERRED EMBODIMENTS

Figure 1:
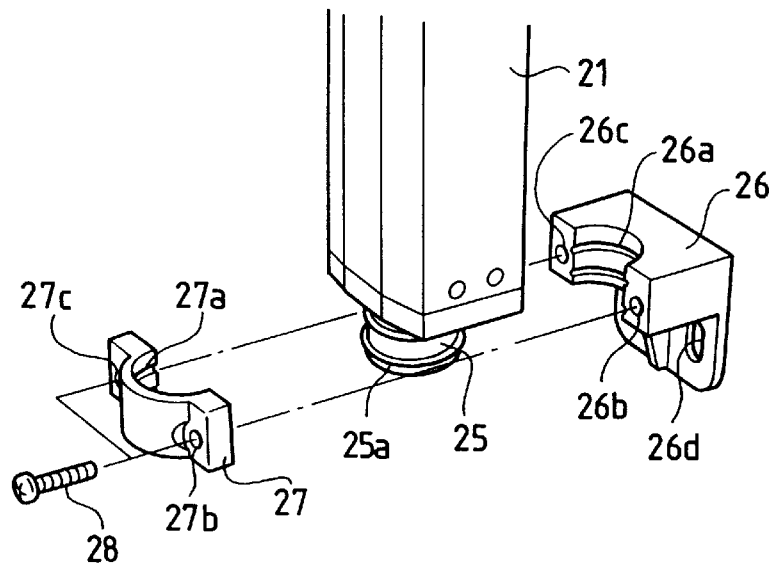
FIG. 1 is an exploded perspective view showing a mounting member of a multi-optical-path photoelectric switch according to an embodiment of the present invention.

An embodiment of the present invention will now be described with reference to FIGS. 1 to 11. Note that the structures of a light emitting portion and a light receiving portion according to the present invention are the same except for the corresponding devices, that is, the light emitting devices or the light receiving devices. Therefore, only either of the structures will now be described. FIG. 4 is an exploded perspective view showing an inner case and a fixing frame which are elements of an extension unit. Referring to FIG. 4, an inner case 12 is made of a sealing material composed of a light transmissive synthetic resin and arranged to seal a required number of light emitting devices or light receiving devices. A male connector 12a is disposed at an end of the inner case 12. A female connector is disposed at another end of the inner case 12.

Projections 12b and 12c are formed on the side surface of the inner case 12. Projections 12d and 12e (not shown) are formed on another side surface of the inner case 12. Stepped portions 12f and 12g are formed from the top surface of the inner case 12. Spaces are formed between the two side surfaces and the stepped portions 12f and 12g.

A fixing frame 13 has a U-shape cross sectional shape facing side, and provided with engaging holes 13b to 13e on the two side surfaces thereof. The projections 12b to 12e of the inner case 12 are engaged to the engaging holes 13b to 13e of the fixing frame 13 so that only the surface of the inner case 12 adjacent to the optical path is allowed to appear. Moreover, the two side surfaces and the bottom surface are covered with a metal plate. Thus, the inner case 12 is received and held by the fixing frame 13. A lock-arm engaging hole 13a, to be described later, is formed at a lengthwise end of a bottom plate of the fixing frame 13. Reference numeral 13f and 13g represent edge portions of the two side surfaces.

Figure 5:
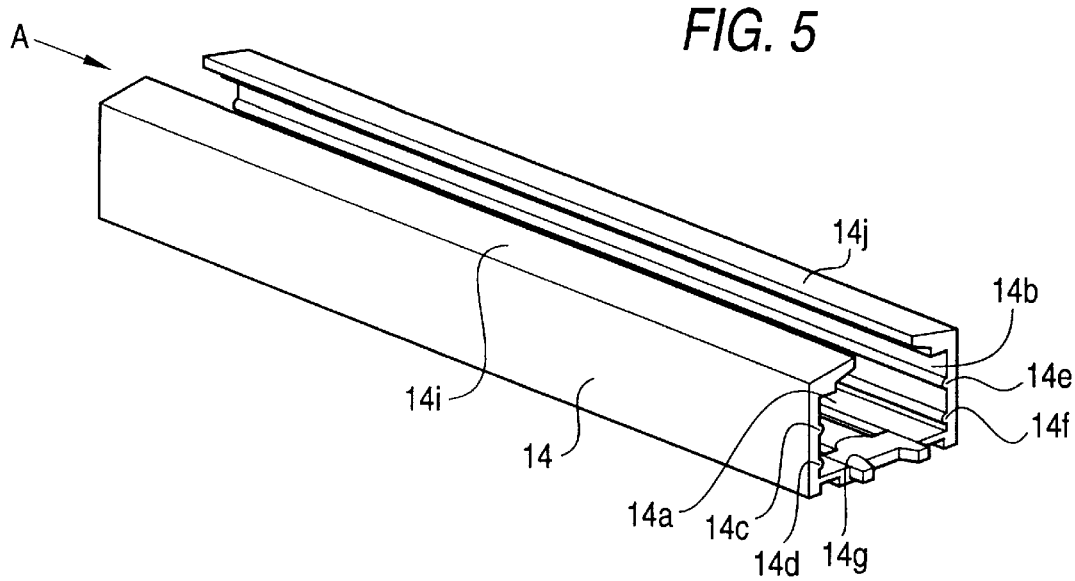
FIG. 5 is an exploded perspective view showing an outer case of the extension unit.

FIG. 5 is a perspective view showing an outer case which is another element of the extension unit. An outer case 14 is formed into a groove shape by molding a metal material. Guide grooves 14a and 14b are formed in the two inner side surfaces of the outer case 14 at symmetrical positions. Guide projections 14c and 14d are formed on either of inner side surfaces of the outer case. Guide projections 14e and 14f are formed on the other inner side surface at symmetrical positions to the guide projections 14c and 14d. A spacer 14g is formed to project over a lengthwise end of the bottom plate of the outer case and arranged to connect units to each other, spacer 14g having two projections. The spacer 14g serves as a connection guide member when the units are connected to each other, while the spacer 14g having elasticity prevents looseness of the units after the units have been connected to each other.

Figure 6:
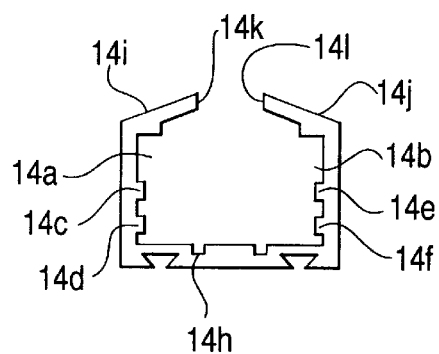
FIG. 6 is a front view from a direction of an arrow A shown in FIG. 3.

FIG. 6 is a front view of a direction of an arrow A shown in FIG. 5. Spacer-insertion holes 14h, into which the spacers of another unit adjacent in the direction of the thickness are inserted, are formed at an end of the bottom surface of the outer case opposite to the ends at which the spacer 14g is formed. Thus, the two projections of the connecting and guiding spacer are inserted into the spacer-insertion holes 14h so that the connection with the other unit is established. Edges 14k and 14l each having the same length as that of the stepped portions 12f and 12g formed on the surface of the inner case 12 are formed at the leading ends of inclined portions 14i and 14j continued from the two side surfaces of the outer case 14.

Figure 7:
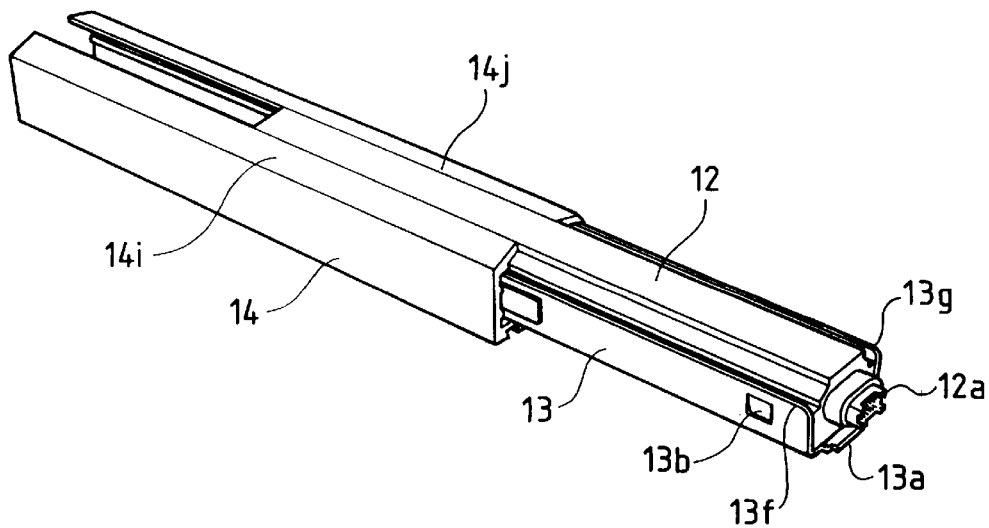
FIG. 7 is a perspective view showing the extension unit.

FIG. 7 is a perspective view showing an assembled state of the extension unit. The edge portions 13f and 13g of the fixing frame 13 which is holding the inner case 12 are brought into contact with the top surfaces of the guide grooves 14a and 14b of the outer case 14. Moreover, the two side surfaces of the fixing frame 13 are slid while the two side surfaces are brought into contact with the guide projections 14c to 14f of the outer case 14. Thus, the fixing frame 13 is inserted into a predetermined position on the inside of the outer case 14. The fixing frame 13 is secured by, for example, inserting a screw into the bottom surface of the outer case 14.

At this time, the stepped portions 12f and 12g formed on the two side surfaces of the inner case 12 and the inclined portions 14i and 14j of the outer case 14 are brought into contact with each other. Thus, the surface of the inner case 12 and the inclined portions 14i and 14j of the outer case 14 form a smooth and continuous surface of the extension unit. Thus, the fixing frame 13 holding the inner case 12 while it permits the optical paths of the optical devices to appear is accommodated and secured in the outer case 14.

Figure 8:
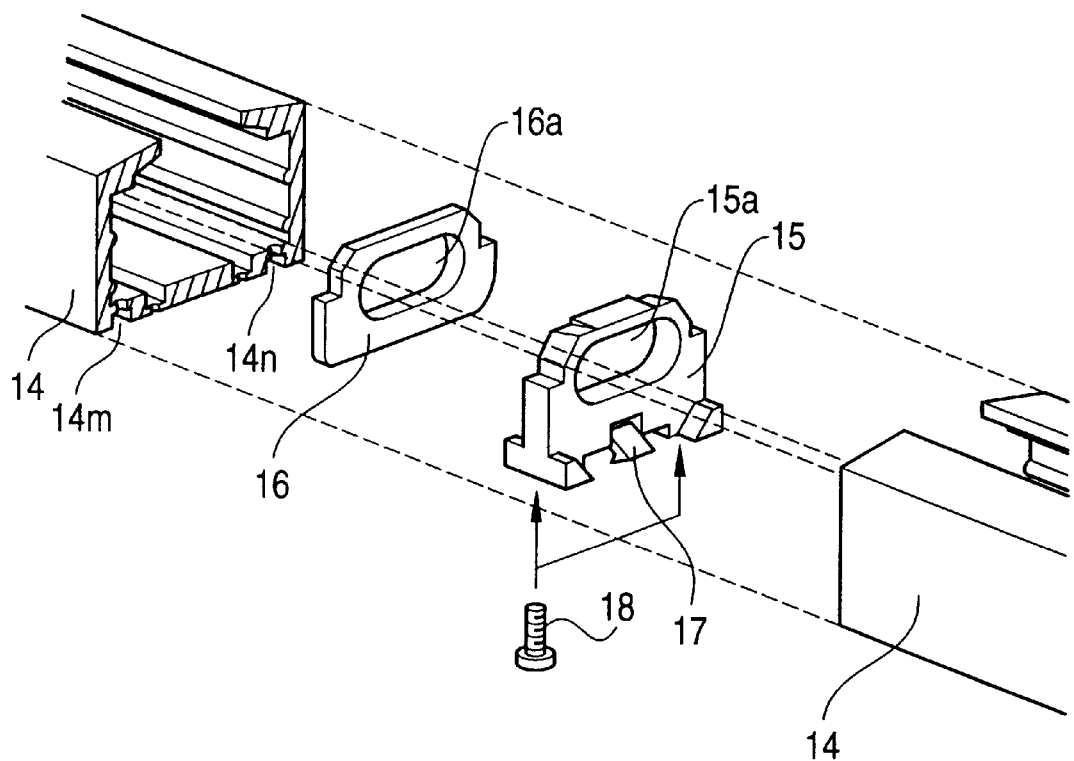
FIG. 8 is an exploded perspective view showing the position of a metal relay member.
Figure 9:
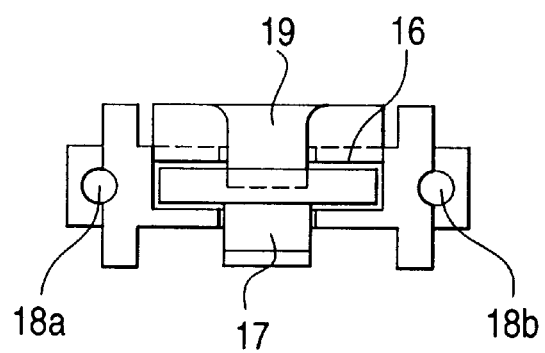
FIG. 9 is a bottom view of the metal relay member.

When the units are connected to each other, a metal relay member is employed. FIG. 8 is an exploded perspective view showing the metal relay member arranged to be joined in the outer case 14. FIG. 9 is a bottom view showing the metal relay member. A metal relay member 15 has an opening 15a in the central portion thereof. A lock arm 17 provided with elasticity by dint of a leaf spring 19 is joined to the lower portion of the metal relay member 15. A packing 16 is made of an elastic material, such as rubber, the packing 16 having an opening 16a in the central portion thereof. The packing 16 is joined to the metal relay member 15.

Screws 18 are screwed in threaded holes 14m and 14n formed in the bottom surface of the outer case 14 and threaded holes 18a and 18b formed in the bottom surface of the metal relay member 15 so that the metal relay member 15 is secured to a position in the outer case 14. The male connector of the inner case 12 is disposed at the position of the metal relay member 15 secured in the outer case 14. When the inner case of the other unit has been inserted into the outer case 14 of the extension unit, the male connector formed at the end of the inner case of the other unit is allowed to pass through the opening 15a of the metal relay member 15 and the opening 16a of the packing 16. Thus, the foregoing male connector is electrically connected to the female connector of the extension unit. The packing 16 absorbs mechanical shock which is made when the connection with the other unit is established. Moreover, the packing 16 serves as dust and water proofing means for the connected portion between the two connectors.

When the other unit is connected, the lock arm 17 of the metal relay member 15 is pressed and moved upwards by the leading end of the lock-arm engaging hole formed in the bottom plate of the fixing frame of the other unit. Thus, the lock arm 17 moves over the bottom plate of the fixing frame while elasticity is given to the lock arm 17 from the leaf spring 19. Thus, the lock arm 17 is firmly engaged to the lock-arm engaging hole. The connecting and guiding spacer formed at either end of the bottom plate of the outer case 14 is inserted into a spacer-insertion hole formed at the leading end of the bottom plate of the outer case of the other unit. Thus, the extension unit and the other unit are electrically and mechanically connected to each other.

Figure 10:
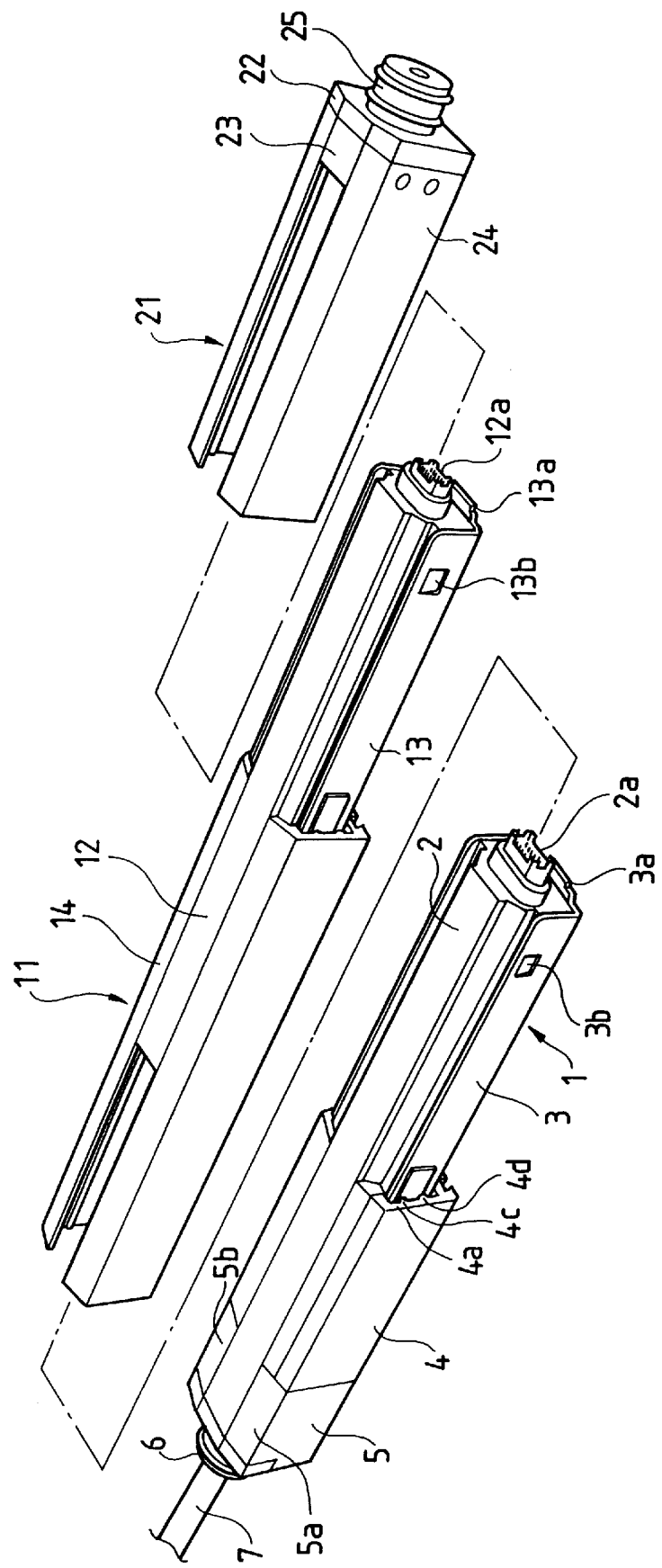
FIG. 10 is a diagram showing an assemble state of another multi-optical-path photoelectric switch.

FIG. 10 is a diagram showing an assembled state of the multi-optical-path photoelectric switch. Referring to FIG. 10, a main unit 1, an extension unit 11 and an end unit 21 are connected in that order. The main unit 1 incorporates an inner case 2 having a sealing member made of light transmissive synthetic resin to seal a required number of light emitting devices or light receiving devices; a fixing frame 3 for holding the inner case 2; an outer case 4 into which the fixing frame 3 is inserted; an end cover 5; a mounting portion 6; and a lead wire 7.

A male connector 2a is disposed at an end of the inner case 2, while another end of the inner case 2 is electrically connected to the lead wire 7 through the mounting portion 6. Projections are formed on the two side surfaces of the inner case 2. The projections are engaged to engaging holes 3b formed in the two side surfaces of the fixing frame 3 so that the inner case 2 is secured to the fixing frame 3.

The cross sectional shape of the outer case 4 is the same as the cross sectional shape of the outer case 14 of the extension unit 11, that is, the cross sectional shape is the groove shape. Namely, guide grooves 4a and 4b are formed in the two inner side surfaces of the outer case 4 at symmetrical positions. Guide projections 4c and 4d are formed on either of the inner side surfaces of the outer case. Guide projections 4e and 4f are formed on the other inner side surface at symmetrical positions (the guide groove 4b and the guide projections 4e and 4f provided for the side surface are omitted from illustration). A spacer-insertion hole is formed at the leading end of the bottom surface at the opened-side end of the outer case 4. The projections of the connecting and guiding spacer of the adjacent extension unit are inserted into the spacer-insertion hole.

The other end of the outer case 4 is in close contact with the end surface of the end cover 5. The fixing frame 3 is secured with a screw or the like inserted into the bottom surfaces of the outer case 4 and the end cover 5. Inclined portions 5a and 5b are provided for the surface of the end cover 5 so that the surface of the inner case 2 and that of the end cover 5 form a smooth and continuous surface without any stepped portion.

The end unit 21 is provided with an end block 22, a metal-relay-member cover 23 and a mounting portion 25. The end block 22 is provided with a male-connector mounting substrate. Thus, the female connector and the male connector of the extension unit 11 are electrically connected to each other in the metal relay member. The mounting portion 25 in the form of a shaft member projecting over the end surface of the end block 22 is held by a mounting member. The metal-relay-member cover 23 is made of a light transmissive synthetic resin material similar to the material of the inner cases 2 and 12. The surface of the metal-relay-member cover 23 and the inclined surface of the outer case 24 form a smooth and continuous surface without any stepped portion.

A spacer projecting in the lengthwise direction is formed on the bottom surface at an opened end of the outer case 24. The fixing frame 13 of the extension unit is inserted into the outer case 24 of the end unit 21. Moreover, the lock arm provided for the metal relay member of the end unit 21 is engaged to the engaging hole 13a formed in the bottom plate of the fixing frame 13. In addition, the spacer provided for the bottom plate of the outer case 24 is inserted into the spacer-insertion hole formed in the bottom plate of the outer case 14 of the extension unit 11. Thus, the extension unit 11 and the end unit 21 are mechanically and electrically connected to each other.

Figure 11:
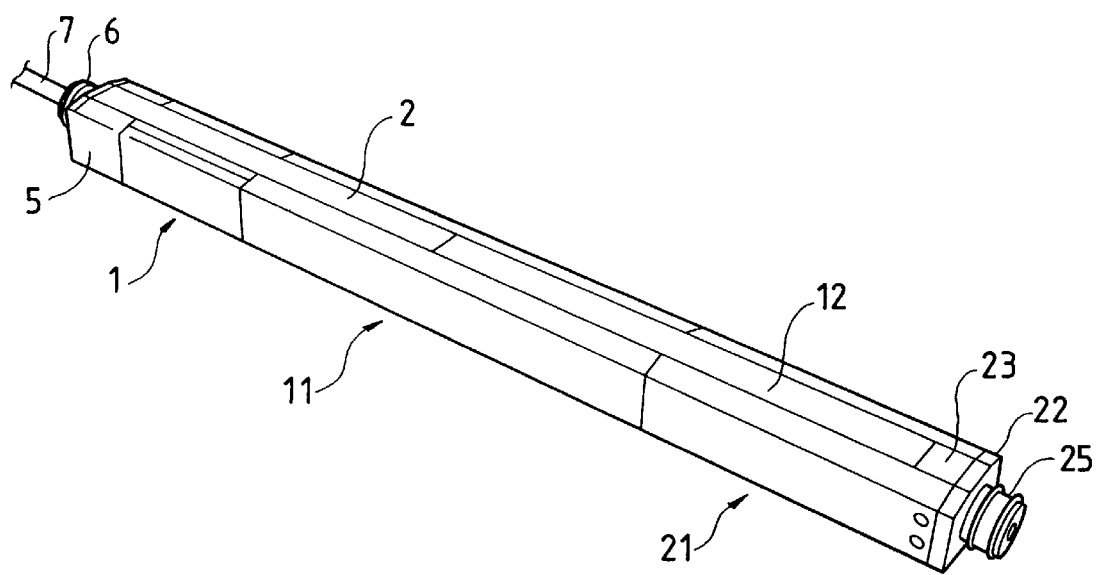
FIG. 11 is a perspective view showing the multi-optical-path photoelectric switch; shown in FIG. 10.

FIG. 11 is a perspective view of the multi-optical-path photoelectric switch mechanically and electrically connected as shown in FIG. 10. In this embodiment, adjacent units are connected to each other by the lock arm provided for the metal relay member disposed on the inside of the bottom surface of the outer case, the lock-arm engaging hole provided at the lengthwise end of the bottom plate of the fixing frame, the spacer formed at the lengthwise end of the bottom plate of the outer case and the spacer-insertion hole formed in the bottom plate of the outer case in the direction of the thickness. Since all of the mechanisms for connecting the units to each other are provided on the inside portion of the bottom surface of the outer case, no projection including the connecting mechanism projects over the outer surface of the outer case. Therefore, the surface of the multi-optical-path photoelectric switch can be formed smoothly.

The above-mentioned multi-optical-path photoelectric switch incorporates the inner unit having the structure that the light transmissive synthetic resin material seals the light emitting devices or the light receiving devices. Therefore, excellent water and dust proof can be realized so that the light emitting devices and the light receiving devices are protected from damage. Moreover, a malfunction can be prevented. In addition, the engaging member provided on the inside of the bottom surface of the groove frame member of either of adjacent units is engaged and secured on the inside of the groove frame member of the other adjacent unit so that the units are mechanically connected to each other. Therefore, the connecting mechanism does not project over the surface of each unit. It leads to a fact that undesirable suspension of the mechanical and electrical connection of the units occurring because of contact of an object with the engaging mechanism can be prevented. Since the fixing frame accommodated in the groove frame member is used to mechanically connect the units to each other, the multi-optical-path photoelectric switch is covered with a double wall frame member. Thus, the mechanical strength can be increased.

In the example shown in FIG. 11, each of the main unit 1, the extension unit 11 and the end unit 21 are connected to one another. However, the end unit 21 may be connected to the main unit 1 to correspond to a required number of optical axes. Moreover, another structure may be employed in which a predetermined number of extension units are connected.

The structure for mounting the multi-optical-path photoelectric switch according to the present invention will now be described. FIG. 1 is an exploded perspective view showing a mounting member provided for the end unit 21. Referring to the drawing, an annular rib 25a projects over the surface of the mounting portion 25 of the end unit 21. A first mounting member 26 is made of metal. A groove 26a for accommodating the rib 25a is formed in the inner surface of the first mounting member 26 made of metal. Moreover, threaded holes 26b and 26c are formed at the end surfaces of the first mounting member 26. A mounting hole 26d has a predetermined size. A mounting hole 26e is formed at a symmetrical position to the mounting hole 26d.

A second mounting member 27 is made of metal and has a groove 27a for accommodating the rib 25a on the inner surface thereof. Moreover, threaded holes 27b and 27c are formed in the end surfaces of the second mounting member 27. The first mounting member 26 made of metal and the second mounting member 27 made of metal which are arranged to be split members incorporate the grooves 26a and 27a to accommodate the annular rib 25a provided for the mounting portion 25. The sizes of the annular rib 25a and the grooves 26a and 27a must be determined to enable the annular rib 25a to smoothly slide in the grooves 26a and 27a. When the end unit 21 is secured to the support member, the weight of the end unit 21 is borne by the rib 25a and the grooves 26a and 27a.

The first mounting member 26 made of metal is secured to the support mount or a support frame with screws which are inserted into the mounting holes 26d and 26e. Then, the annular rib 25a of the mounting portion 25 is accommodated in the groove 26a of the first mounting member 26 made of metal. Moreover, the groove 27a of the second mounting device 27 made of metal is accommodated in the rib 25a. Thus, the first mounting member 26 made of metal and the second mounting device 27 made of metal which are split members hold the mounting portion 25 therebetween.

Screws 28 are inserted into the thread holes 27b and 26b and the thread holes 27a and 26a of the second mounting device 27 made of metal. Thus, the first mounting member 26 made of metal and the second mounting device 27 made of metal are joined to each other with screws. The overall outer surface of the mounting portion 25 is rotatively held by the first mounting member 26 made of metal and the second mounting device 27 made of metal. In order to obtain an optical path making an arbitrary angle in the circumferential direction, the mounting portion 25 is rotated to adjust the position at which the end unit 21 is fixed. Thus, the mounting portion 25 provided for the end of the end unit 21 serves as the shaft member for the end unit 21.

The direction of the optical path is changed such that the screws 28 are loosen in a state in which the first mounting member 26 made of metal is secured to the support member so that a gap is enlarged to enable the rib 25a of the mounting portion 25 to slide in the grooves 26a and 27a. Thus, rotation is performed between the first mounting member 26 made of metal and the second mounting device 27 made of metal in the circumferential direction. Thus, the change can easily be performed. Since the above-mentioned structure is employed, the embodiment shown in FIG. 1 enables the direction of the optical path to be changed to an arbitrary direction in the circumferential direction. If the direction of the optical path of either of the light emitting portion or the light receiving portion is changed, the corresponding light emitting portion or the light receiving portion is moved to a coincident position. Thus, the optical paths are made coincide with each other.

Figure 2:
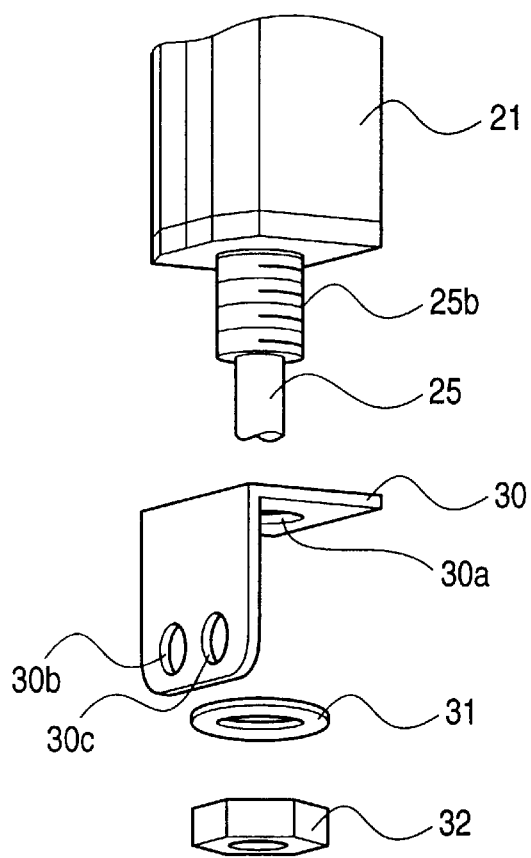
FIG. 2 is an exploded perspective view showing another example of the mounting member.

FIG. 2 is an exploded perspective view showing another example of the member for mounting the units. A thread 25b is provided for the mounting portion 25 of the end unit 21. A metal mounting member 30 has a through hole 30a into which the thread 25b provided for the mounting portion 25, the through hole 30a being formed at the central portion of the metal mounting member 30. Mounting holes 30b and 30c are provided, for securing the end unit 21 to a support member, such as a support mount or a support frame.

In the example shown in FIG. 2, the metal mounting member 30 is secured to a support member, such as a support mount or a support frame, with screws which are inserted into the mounting holes 30b and 30c. Then, the thread 25b provided for the mounting portion 25 of the end unit 21 is allowed to pass through the through hole 30a formed in the central portion of the metal mounting member 30. Thus, the end surface of the end unit 21 is placed on the surface of the metal mounting member 30. The direction of the optical axis of the end unit 21 is determined to make an arbitrary angle in the circumferential direction. A washer 31 is interposed on the thread 25b from a reverse side of the metal mounting member 30, and then a nut 32 is tightened. Thus, the end unit 21 is rotatively held by the metal mounting member 30. When the direction of the optical axis is changed, the nut 32 is loosened to rotate the mounting portion 25 in the circumferential direction in the through hole 30a. Therefore, the direction of the optical axis can arbitrarily be changed in the circumferential direction.

Figure 3:
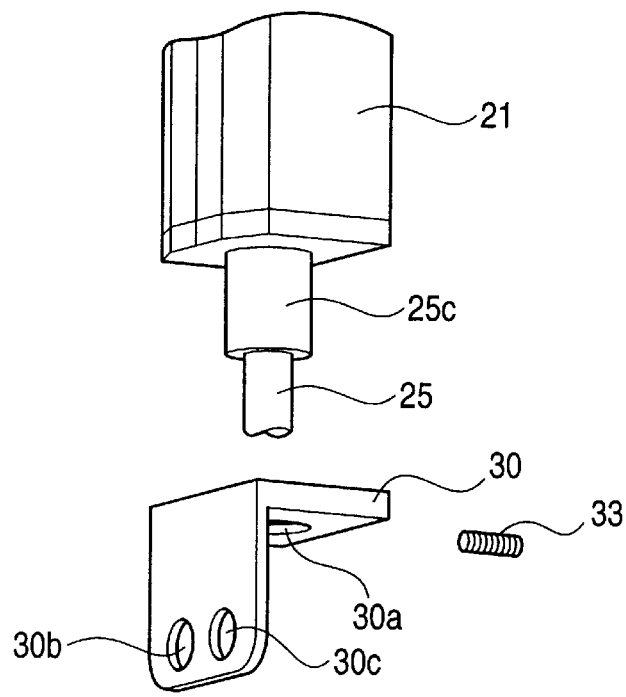
FIG. 3 is an exploded perspective view showing another example of the mounting member.
Figure 4:
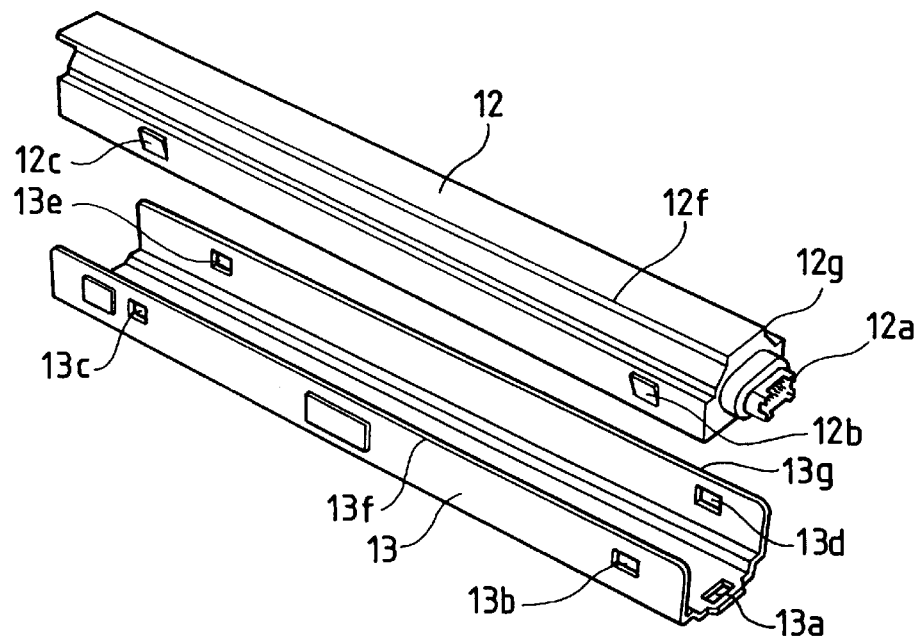
FIG. 4 is an exploded perspective view showing a portion of an extension unit.

FIG. 3 is a an exploded perspective view showing another example of the member for mounting the units. In the structure shown in FIG. 3, a large-diameter portion 25c is provided for the mounting portion 25. The mounting portion 25 is inserted into the through hole 30a of the metal mounting member 30. Then, the end surface of the large-diameter portion 25c is placed on the surface of the metal mounting member 30. A threaded hole (not shown) which reaches the through hole 30a is formed in the side surface of the metal mounting member 30. A setting screw 33 is screwed in to press the surface of the mounting portion 25 so that the mounting portion 25 is held by the metal mounting member 30.

Also in this example, the overall outer portion of the mounting portion 25 is rotatively held in the through hole 30a of the metal mounting member 30. When the direction of the optical axis is changed, the setting screw 33 is loosened to rotate the mounting portion 25 in the circumferential direction in the through hole 30a. Thus, the direction of the optical axis can arbitrarily be changed in the circumferential direction.

Figure 12:
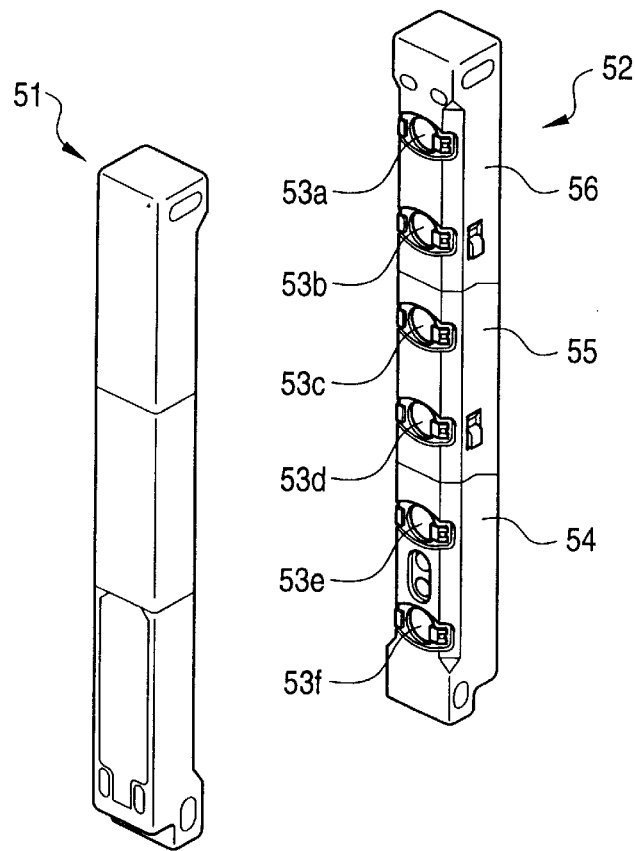
FIG. 12 is a perspective view showing an example of the multi-optical-path photoelectric switch.
Figure 13:
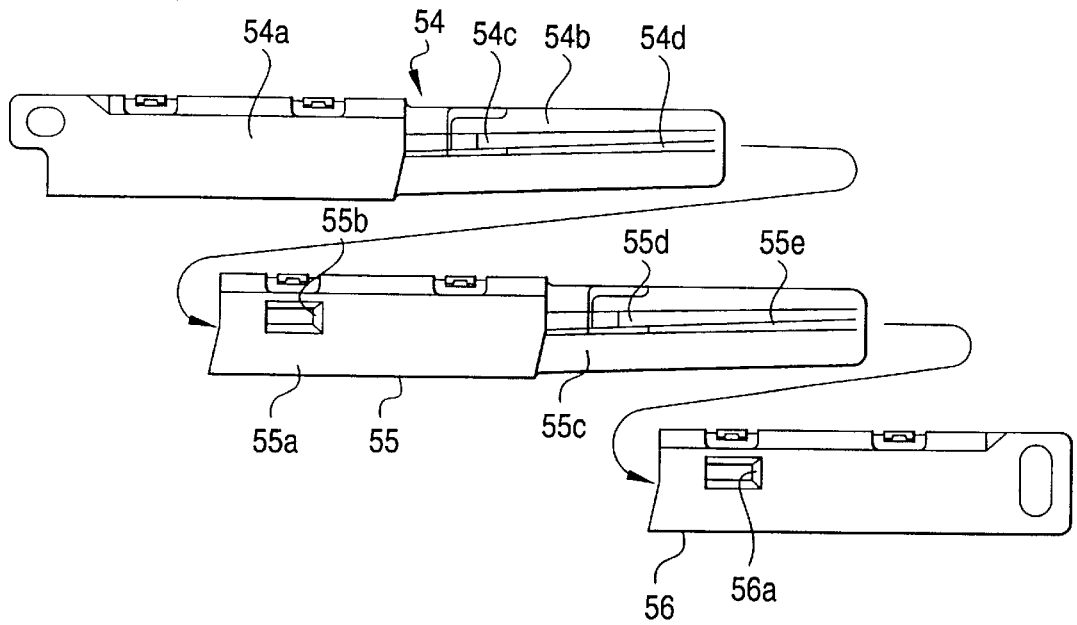
FIG. 13 is a diagram showing an assembled state of the multi-optical-path photoelectric switch shown in FIG. 12.

The above-mentioned embodiment has been described about the structure in which the direction of the optical axis of the multi-optical-path photoelectric switch formed by connecting a multiplicity of the units is changed. The present invention may be applied to a structure in which a predetermined number of light emitting devices and light receiving devices are provided for a single unit if the structure enables the direction of the optical axis to be changed in a state in which the multi-optical-path photoelectric switch is secured to a support member. As a multi-optical-path photoelectric switch formed by connecting a multiplicity of the units, the present invention may be applied to the structure shown in FIGS. 12 and 13.

As described above, according the present invention, each of the units of the light emitting portion and light receiving portion is provided with the shaft member, the overall outer portion of which is rotatively held by the mounting portion which is secured to the support member. Therefore, when the shaft member is rotated, the direction of the optical axis can easily be changed to an arbitrary direction in the circumferential direction.

Moreover, even the multi-optical-path photoelectric switch having the structure that the number of optical axes are changed by varying the number of units is permitted to easily change the direction of the optical axis to an arbitrary direction in the circumferential direction.

What is claimed is:

1. A multi-optical-path photoelectric switch comprising:
   a light emitting unit having a plurality of light emitting devices; and
   a light receiving unit having the same number of light receiving devices as said light emitting devices, each unit including, a cylindrically-shaped shaft member at one end, a support member having a cylindrically-shaped support surface which rotatably supports said shaft member, and a joint member for securely jointing said shaft member and said support member, wherein when said joint member is tightened, said support member fixes said shaft member, and when said joint member is loosened, said support member allows said shaft member to rotate, to thereby secure said shaft member relative to said support member at any arbitrary position in a circumferential direction thereof.

2. The multi-optical-path photoelectric switch according to claim 1, wherein said light emitting unit comprises plural units each having the predetermined number of said light emitting devices, and said light receiving unit comprises plural units each having the light receiving devices, the number of which is the predetermined number which is the same as the number of said light emitting devices.

3. The multi-optical-path photoelectric switch according to claim 1, wherein said support member has a semi-cylindrical shape, and said joint member has a semi-cylindrical shape wherein said semi-cylindrical shapes of said support member and said joint member form a hollow cylindrical portion to receive said shaft member.

4. The mulit-optical-path photoelectric switch according to claim 3, wherein said shaft member has an annular projection, said support member has a groove inside said semi-cylindrical shape for receiving said annular projection of said shaft member, and said joint member has a groove inside said semi-cylindrical shape for receiving said annular projection of said shaft member.

5. The multi-optical-path photoelectric switch according to claim 1, wherein said shaft member has a threaded groove portion, said support member comprises an L-shape plate member having a hole for receiving said threaded groove portion of said shaft member, and said joint member comprises a nut for screwing said threaded groove portion of said shaft member.

6. A multi-optical-path photoelectric switch according to claim 1, wherein said shaft member has a large diameter portion and a small diameter portion, said support member comprises an L-shape plate member having a hole for receiving the small diameter portion of said shaft member, said hole having a diameter larger than that of the small diameter portion and smaller than that of the large diameter portion, and said joint member comprises a screw for screwing in to press a surface of the small diameter portion of said shaft member.

7. A multi-optical-path photoelectric switch comprising:

a light emitting unit having a plurality of light emitting devices; and a light receiving unit having the same number of light receiving devices as said light emitting devices, each unit including, a shaft member at one end, said shaft member having a threaded portion, a support member including an L-shape plate member and rotatably supporting said shaft member, said L-shaped plate member having a hole for receiving said shaft member, and a joint member having a nut for screwing said threaded portion of said shaft member, wherein when said joint member is tightened, said support member fixes said shaft member, and when said joint member is loosened, said support member allows said shaft member to rotate.

* * * * *